(12) United States Patent
Kawakami et al.

(10) Patent No.: US 10,256,295 B2
(45) Date of Patent: Apr. 9, 2019

(54) SEMICONDUCTOR DEVICE

(71) Applicant: TOYOTA JIDOSHA KABUSHIKI KAISHA, Toyota-shi, Aichi-ken (JP)

(72) Inventors: Masahiro Kawakami, Nissin (JP); Tomohiko Mori, Nagakute (JP); Hiroyuki Ueda, Nagakute (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/704,703

(22) Filed: Sep. 14, 2017

(65) Prior Publication Data

US 2018/0102405 A1   Apr. 12, 2018

(30) Foreign Application Priority Data

Oct. 7, 2016   (JP) .................................. 2016-199498

(51) Int. Cl.
| | |
|---|---|
| *H01L 29/06* | (2006.01) |
| *H01L 21/02* | (2006.01) |
| *H01L 21/265* | (2006.01) |
| *H01L 21/306* | (2006.01) |
| *H01L 21/324* | (2006.01) |
| *H01L 29/10* | (2006.01) |
| *H01L 29/20* | (2006.01) |
| *H01L 29/739* | (2006.01) |
| *H01L 29/78* | (2006.01) |

(52) U.S. Cl.
CPC ........ *H01L 29/063* (2013.01); *H01L 21/0254* (2013.01); *H01L 21/02576* (2013.01); *H01L 21/26546* (2013.01); *H01L 21/30617* (2013.01); *H01L 21/3245* (2013.01); *H01L 29/1095* (2013.01); *H01L 29/2003* (2013.01); *H01L 29/7395* (2013.01); *H01L 29/7802* (2013.01)

(58) Field of Classification Search
CPC ............... H01L 29/063; H01L 29/1095; H01L 29/2003; H01L 21/0254; H01L 21/30617
See application file for complete search history.

(56) References Cited

U.S. PATENT DOCUMENTS

| | | | |
|---|---|---|---|
| 5,939,752 A | 8/1999 | Williams | |
| 2006/0057796 A1* | 3/2006 | Harada | ............... H01L 21/0465 438/199 |
| 2007/0164346 A1* | 7/2007 | Yoshida | ............. G11C 16/0433 257/315 |
| 2008/0102585 A1* | 5/2008 | Nakamura | ............ H01L 21/049 438/285 |

(Continued)

FOREIGN PATENT DOCUMENTS

| | | |
|---|---|---|
| JP | S57-042164 A | 3/1982 |
| JP | 2006-313859 A | 11/2006 |

(Continued)

*Primary Examiner* — Dung A. Le
(74) *Attorney, Agent, or Firm* — Oliff PLC

(57) ABSTRACT

A semiconductor device includes an outside-of-well n-type region, a p-type well region surrounded by the outside-of-well n-type region, an inside-of-well n-type region, and a gate electrode. The outside-of-well n-type region includes an impurity low-concentration region that is in contact with the p-type well region, and an impurity high-concentration region that is separated from the p-type well region by the impurity low-concentration region.

4 Claims, 5 Drawing Sheets

(56) References Cited

U.S. PATENT DOCUMENTS

| | | | |
|---|---|---|---|
| 2012/0139005 A1 | 6/2012 | Ikimura et al. | |
| 2014/0145209 A1* | 5/2014 | Kumagai | H01L 29/41766 257/77 |
| 2015/0162431 A1* | 6/2015 | Zinn | H01L 29/7802 257/329 |
| 2015/0318389 A1* | 11/2015 | Tsuchiya | H01L 29/7813 257/77 |
| 2017/0200788 A1* | 7/2017 | Gotoh | H01L 29/1608 |

FOREIGN PATENT DOCUMENTS

| | | |
|---|---|---|
| JP | 2007-149985 A | 6/2007 |
| JP | 2009-076762 A | 4/2009 |
| JP | 2010-067670 A | 3/2010 |
| JP | 2010-232355 A | 10/2010 |
| JP | 2012-064741 A | 3/2012 |
| JP | 2012-124207 A | 6/2012 |

\* cited by examiner

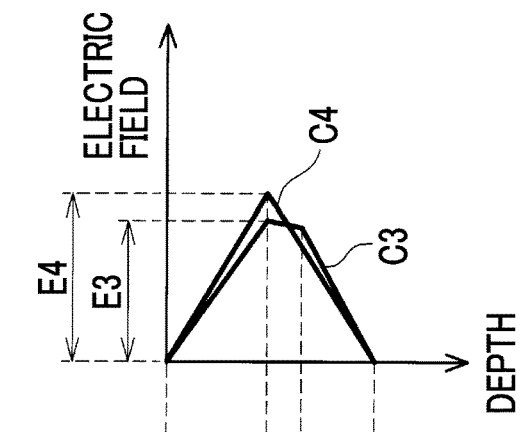
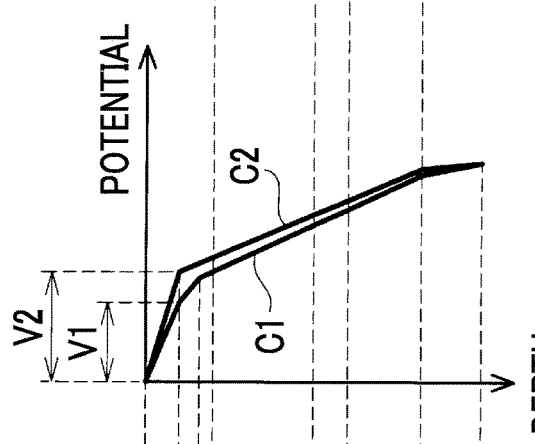
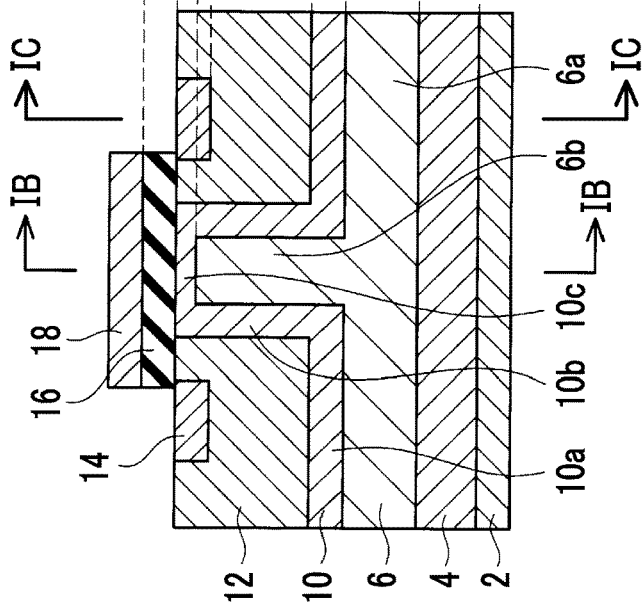

US 10,256,295 B2

SEMICONDUCTOR DEVICE

INCORPORATION BY REFERENCE

The disclosure of Japanese Patent Application No. 2016-199498 filed on Oct. 7, 2016 including the specification, drawings and abstract is incorporated herein by reference in its entirety.

BACKGROUND

1. Technical Field

The disclosure relates to a semiconductor device.

2. Description of Related Art

As illustrated in FIG. 10 by way of example, a field effect transistor (FET) including an n-type drift region 6, p-type well regions 12, n-type source regions 14, insulating film 16, and a gate electrode 18 is known. The p-type well regions 12 are surrounded by the n-type drift region 6, and are exposed to a surface of a semiconductor substrate. The n-type source regions 14 are surrounded by the p-type well regions 12, and are exposed to the surface of the semiconductor substrate. The gate electrode 18 is opposed, via the insulating film 16, to a surface of each p-type well region 12 in a range in which the n-type drift region 6 and the n-type source region 14 are separated or spaced from each other.

While no positive voltage is applied to the gate electrode 18, the n-type drift region 6 and the n-type source region 14 are separated by the p-type well region 12, and high resistance appears between the drift region 6 and each source region 14. If a positive voltage is applied to the gate electrode 18, an inversion layer is formed in a surface of the p-type well region 12 in a range opposed to the gate electrode 18 via the insulating film 16, namely, a surface of the p-type well region 12 in a range in which the n-type drift region 6 and the n-type source region 14 are separated or spaced from each other, and low resistance appears between the drift region 6 and the source region 14. With the structure of FIG. 10, the FET is obtained. In FIG. 10, reference number 4 denotes drain region, and reference number 2 denotes drain electrode.

In the FET, the resistance (on-resistance) between the source region 14 and the drain region 4 is required to be low in a condition where a positive voltage is applied to the gate electrode 18. Also, in a condition where no positive voltage is applied to the gate electrode 18, the drain region 4 has a high potential, and the source region 14 and the gate electrode 18 have low potentials. In the FET, even if the potential of the drain region 4 becomes high, it is required to prevent electric current from flowing into the source region 14 or the gate electrode 18 (these components 14, 18 have high withstand voltages).

In order to reduce the on-resistance, it is advantageous to increase the impurity concentration of the n-type drift region 6. However, if the impurity concentration of the n-type drift region 6 is increased, a potential difference between a surface and a rear surface of the insulating film 16 becomes large when no positive voltage is applied to the gate electrode 18, and current is more likely to flow into the gate electrode 18. If the impurity concentration of the n-type drift region 6 is increased, the gate withstand voltage is reduced. Also, if the impurity concentration of the n-type drift region 6 is increased, the intensity of electric field in the vicinity of an interface between the p-type well region 12 and the n-type drift region 6 is increased, in a condition where no positive voltage is applied to the gate electrode 18, which may result in occurrence of an avalanche breakdown, and electric current is more likely to flow into the n-type source region 14. If the impurity concentration of the n-type drift region 6 is increased, the withstand voltage between the drain and the source is reduced. Namely, in the FET, there is a trade-off relationship that, if the on-resistance is reduced, the gate withstand voltage is reduced, and the withstand voltage between the drain and the source is reduced.

An attempt to solve the trade-off problem is disclosed in Japanese Patent Application Publication No. 2012-064741 (JP 2012-064741 A). According to a technology disclosed in this publication, the impurity concentration of an n-type region located between a pair of p-type well regions is controlled so as to vary from portion to portion, as shown in FIG. 11. Namely, a pair of n-type impurity high-concentration regions 24 are provided in portions of the n-type region which contact with side faces of the p-type well regions 12, and an n-type impurity low-concentration region 22 is provided in a portion of the n-type region which is located between the high-concentration regions 24.

SUMMARY

According to the structure of FIG. 11, the on-resistance is reduced due to the presence of the n-type impurity high-concentration regions 24, and a potential difference that appears in the insulating film 16 is reduced due to the presence of the n-type impurity low-concentration region 22, so that reduction of the gate withstand voltage can be curbed. However, the structure of FIG. 11 cannot cope with the problem of reduction of the withstand voltage between the drain and the source. Since the n-type impurity high-concentration region 24 contacts with the p-type well region 12, the intensity of electric field in the vicinity of an interface between the regions 12, 24 is increased, which may result in occurrence of an avalanche breakdown, and current is more likely to flow into the n-type source region 14. With the technology of JP 2012-064741A, the problem of reduction of the withstand voltage between the drain and the source cannot be coped with or solved.

In this disclosure, a technology for preventing the gate withstand voltage and the withstand voltage between the drain and the source from being reduced even when the on-resistance is reduced is described.

A semiconductor device described in this disclosure includes a p-type well region, an outside-of-well n-type region, an inside-of-well n-type region, an insulating film, and a gate electrode. The p-type well region is surrounded by the outside-of-well n-type region and is exposed to a surface of a semiconductor substrate. The inside-of-well n-type region is surrounded by the p-type well region and is exposed to the surface of the semiconductor substrate. The gate electrode is opposed, via the insulating film, to a surface of the p-type well region in a range in which the outside-of-well n-type region and the inside-of-well n-type region are separated from each other. The outside-of-well n-type region includes an impurity low-concentration region that is in contact with the p-type well region, and an impurity high-concentration region that is separated from the p-type well region by the impurity low-concentration region. The impurity low-concentration region contains a lower concentration of an n-type impurity than the impurity high-concentration region.

With the above arrangement, the on-resistance is reduced due to the presence of the n-type impurity high-concentration region, and reduction of the gate withstand voltage can be curbed by reducing a potential difference across the insulating film due to the presence of the n-type impurity low-concentration region. Further, since the n-type impurity low-concentration region is in contact with the p-type well region, the intensity of electric field in the vicinity of an interface between these regions is reduced, and avalanche breakdown is less likely or unlikely to occur, so that current can be prevented from flowing into the inside-of-well n-type region. It is also possible to cope with a problem of reduction of the withstand voltage between the drain and the source.

In one embodiment, the p-type well region provides a body region, and the outside-of-well n-type region provides a drift region, while the inside-of-well n-type region provides a source region. However, the structure of the semiconductor device is not limited to this arrangement. The technology described in this disclosure is also effectively applied to a bipolar FET (so-called IGBT (Insulated Gate Bipolar Transistor), and, in this case, the inside-of-well n-type region provides an emitter region.

While the n-type impurity low-concentration region and the n-type impurity high-concentration region may be in direct contact with each other, an n-type impurity middle-concentration region may be interposed between the low-concentration region and the high-concentration region. While the middle-concentration region may have a uniform impurity concentration, the impurity concentration may increase gradually or in stages, from the low-concentration region side to the high-concentration region side.

This disclosure is also concerned with a new method of producing a semiconductor device. According to the production method, a crystal of an n-type semiconductor is grown on a surface of an n-type semiconductor substrate, a part of the n-type semiconductor is etched from a surface of the semiconductor substrate on which the crystal has been grown, a crystal of an n-type semiconductor is grown again on a surface of the semiconductor substrate that has been etched, a p-type well region is formed on a surface of the semiconductor substrate on which the crystal has been grown again, and an n-type impurity is injected into a part of the p-type well region and is subjected to heat treatment. In the process as described above, the impurity concentration of the n-type semiconductor grown again by crystal growth is set to be lower than the impurity concentration of the n-type semiconductor grown before etching. According to the production method as described above, the semiconductor device is produced which includes the p-type well region, outside-of-well n-type region surrounding the p-type well region, and an inside-of-well n-type region surrounded by the p-type well region, and in which the outside-of-well n-type region includes an impurity low-concentration region that is in contact with the p-type well region, and an impurity high-concentration region that is separated from the p-type well region by the impurity low-concentration region.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein:

FIG. 1A is a cross-sectional view of a semiconductor device of a first embodiment;

FIG. 1B is a graph showing the potential at respective positions along line IB-IB in the semiconductor device of FIG. 1A when it is in the OFF state;

FIG. 1C is a graph showing the intensity of electric field at respective positions along line IC-IC in the semiconductor device of FIG. 1A when it is in the OFF state;

DETAILED DESCRIPTION OF EMBODIMENTS

Figure 2A:
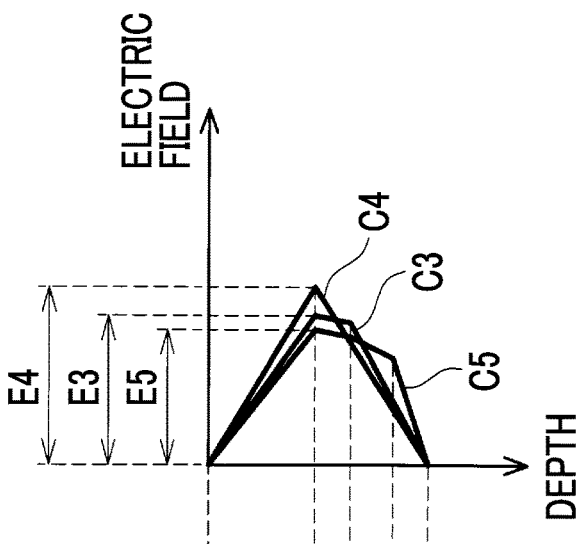
FIG. 2A is a cross-sectional view of a semiconductor device of a second embodiment.

Some characteristics of embodiments described below will be listed. (1) An n-type drift region provides an outside-of-well n-type region. (2) A p-type body region provides a p-type well region. (3) An n-type source region provides an inside-of-well n-type region. (4) An n-type emitter region provides an inside-of-well n-type region. (5) An n-type drain region is formed on a rear surface of a semiconductor substrate of the outside-of-well n-type region, and a drain electrode is formed on the rear surface of the semiconductor substrate. (6) An n-type drain region is formed on a surface of the semiconductor substrate of the outside-of-well n-type region, and a drain electrode is formed on the surface of the semiconductor substrate. (7) The outside-of-well n-type region is formed from a semiconductor layer epitaxially grown on the semiconductor substrate. (8) The semiconductor structure is formed of a wide-gap semiconductor having a wider band gap than Si. (9) The semiconductor structure is formed of a GaN-containing semiconductor.

FIG. 1A shows a semiconductor device of a first embodiment in cross-section. In this embodiment, outside-of-well n-type regions 6, 10 provide an n-type drift region, and a p-type well region 12 provides a p-type body region, while an inside-of-well n-type region 14 provides an n-type source region.

In FIG. 1A, reference numeral 2 denotes a drain electrode formed on a rear surface of a semiconductor substrate. Reference numeral 4 denotes a drain region including a high concentration of n-type impurity, which is in ohmic contact with the drain electrode 2. As will be apparent from a production method that will be described later, the drain region 4 consists of a seed substrate with which epitaxial growth is started. The semiconductor device of FIG. 1A was produced by using the seed substrate having a suitable concentration of n-type impurity, as the drain region 4.

In FIG. 1A a pair of p-type body regions 12, 12 are illustrated. The number of the body regions is not particularly restricted, but the technology described in this disclosure may be effectively applied to a semiconductor device including only one body region, or a semiconductor device including three or more body regions. The p-type body region 12 is formed in a range exposed to a surface of the semiconductor substrate, and is surrounded by the n-type drift regions 6, 10. An n-type source region 14 is formed in a range exposed to the surface of the semiconductor substrate, and is surrounded by the p-type body region 12. The n-type drift regions 6, 10 and the n-type source region 14 are separated by the p-type body region 12. An insulating film 16 is formed on a surface of the p-type body region 12 in a range where the region 12 separates the n-type drift regions 6, 10 from the n-type source region 14, and a gate electrode 18 is formed on a surface of the insulating film 16. A source electrode (not shown) is formed on the surface of the semiconductor substrate, such that the source electrode in in ohmic contact with the n-type source region 14. The source electrode and the gate electrode 18 are insulated from each other by an interlayer insulating film (not shown). A contact region that includes a high concentration of p-type impurity and is in ohmic contact with the source electrode may be formed in a region that is located in the p-type body region 12 and is in contact with the source electrode. The p-type body region 12 needs to be inverted due to a voltage applied to the gate electrode 18, and the concentration of the p-type impurity is low; therefore, the p-type body region 12 may not be in ohmic contact with the source electrode, and its potential may be unstable. If the above-mentioned contact region is provided, the potential of the p-type body region 12 becomes equal to the potential of the source electrode.

In the semiconductor device of FIG. 1A, the drift region is formed by n-type impurity low-concentration region 10 having a low concentration of n-type impurity, and n-type impurity high-concentration region 6 having a high concentration of n-type impurity. The high concentration mentioned herein indicates that the impurity concentration of the region 6 is higher than that of the low-concentration drift region 10, but is lower than that of the drain region 4. The impurity concentrations of the drift regions 6, 10 are within a range low enough to assure sufficient withstand voltage, and the drift region is divided into the low-concentration region 10 and the high-concentration region 6, within this low concentration range.

The n-type impurity low-concentration region 10, which forms a part of the drift region, is located so as to be in contact with the p-type body region 12, and surrounds the p-type body region 12. The n-type impurity high-concentration region 6, which forms the remaining part of the drift region, is formed at a position separated from the p-type body region 12 by the low-concentration region 10.

The high-concentration drift region 6 includes a horizontal portion 6a laminated on top of the drain region 4, and a vertical portion 6b that extends from the horizontal portion 6a toward the surface of the semiconductor substrate. The upper surface of the vertical portion 6b does not reach the surface of the semiconductor substrate. The vertical portion 6b is formed in a gap between the pair of p-type body regions 12, 12. The low-concentration drift region 10 is formed on a surface of the high-concentration drift region 6. The low-concentration drift region 10 includes a horizontal portion 10a that covers a surface of the high-concentration horizontal layer 6a, vertical portion 10b that extends along a side face of the high-concentration vertical portion 6b, and an upper horizontal portion 10c that covers the top face of the high-concentration vertical portion 6b. The low-concentration horizontal portion 10a is in contact with a bottom of the p-type body region 12. The low-concentration vertical portion 10b is in contact with a side face of the p-type body region 12. The low-concentration upper horizontal portion 10c is exposed to the surface of the semiconductor substrate, and is in contact with the insulating film 16. In this embodiment, the gap is provided between the pair of p-type body regions 12, 12, and the insulating film 16 and the gate electrode 18 extend over the gap between the adjacent p-type body regions 12, 12. In the gap, the upper horizontal portion 10c of the low-concentration drift region 10 is exposed to the surface of the semiconductor substrate. Namely, the lower surface of the insulating film 16 is in contact with the low-concentration drift region 10. With this arrangement, a potential difference that appears in the insulating film 16 is reduced.

When a positive voltage is applied to the gate electrode 18, the p-type body region 12 in a range opposed to the insulating film 16 is inverted, and resistance between the n-type source region 14 and the n-type drift regions 6, 10 is reduced. As a result, current flows between the source electrode and the drain electrode 2. Since the impurity high-concentration region 6 exists in the current path, the resistance between the source and the drain is reduced. Thus, the on-resistance of the semiconductor device of FIG. 1A is low.

While no positive voltage is applied to the gate electrode 18, a high voltage is applied to the drain electrode 2, and the source electrode and the gate electrode 18 are grounded. In this condition, a potential difference between the surface and rear surface of the insulating film 16 is increased, and current is more likely to flow into the gate electrode 18. FIG. 1B shows variations in the potential within the semiconductor device in the above condition, and shows potentials at respective positions along line IB-IB in FIG. 1A. In FIG. 1B, graph C1 indicates the potential in the case of the semiconductor device of FIG. 1A, and graph C2 indicates the potential in the case (comparative example) in which there is no low-concentration drift region 10, and space between the drain region 4 and the p-type body region 12 is filled with the high-concentration drift region 6. V1 indicates a potential difference that appears between the surface and rear surface of the insulating film 16, in the case of FIG. 1A. On the other hand, V2 indicates a potential difference that appears between the surface and rear surface of the insulating film 16, in the case of the comparative example. Apparently, V1 is smaller than V2. If the low-concentration drift region 10 is used, reduction of the gate withstand voltage can be prevented. Although not illustrated in the drawings, increase of the on-resistance in the case where the low-concentration drift region 10 is used can be reduced to a negligible amount, as compared with the on-resistance of the comparative example.

While no positive voltage is applied to the gate electrode 18, a high voltage is applied to the drain electrode 2, and the source electrode and the gate electrode 18 are grounded. In this condition, an electric field is likely to concentrate in the vicinity of an interface between the p-type body region 12 and the n-type region. Graph C3 of FIG. 1C indicates the intensity of electric field generated at an interface between the p-type body region 12 and the n-type low-concentration drift region 10 (which are in contact with each other in FIG. 1A) of the semiconductor device of FIG. 1A, and E3 indicates the maximum electric field intensity. Graph C3 of FIG. 1C shows the intensity of electric field generated at respective positions along line IC-IC in FIG. 1A. Graph C4 indicates the intensity of an electric field generated at an interface between the p-type body region 12 and the n-type drift region 6 (the low-concentration drift region 10 does not exist in the comparative example), and E4 indicates the maximum electric field intensity. Apparently, E3 is smaller than E4. Thus, if the low-concentration drift region 10 is used, reduction of the withstand voltage between the source and the drain can be prevented.

Figure 2B:
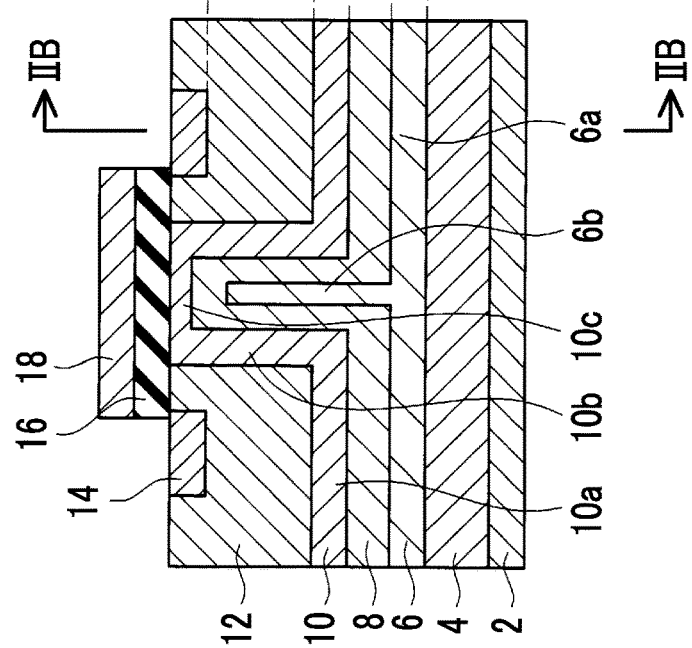
FIG. 2B is graph showing the intensity of electric field in the semiconductor device of FIG. 2A when it is in the OFF state.

In a second embodiment, an n-type middle-concentration drift region 8 is formed between an n-type low-concentration drift region 10 and an n-type high-concentration drift region 6, as shown in FIG. 2A. In FIG. 2B, which corresponds to FIG. 1C, graphs C3, C4 are those as described above with reference to FIG. 1C. Graph C5 indicates the electric field intensity of the semiconductor device shown in FIG. 2A, and E5 indicates the maximum electric field intensity of the semiconductor device shown in FIG. 2A. Graph C5 of FIG. 2B shows the intensity of electric field generated at respective positions along line IIB-IIB in FIG. 2A. Apparently, E5 is smaller than E4, and E5 is smaller than E3. If the middle-concentration drift region 8 is added to between the low-concentration drift region 10 and the high-concentration drift region 6, the withstand voltage between the source and the drain is improved.

While a single sheet of middle-concentration drift region 8 is added to between the high-concentration drift region 6 and the low-concentration drift region 10 in FIG. 2A, two or more sheets of middle-concentration drift regions having different impurity concentrations may be provided. In this case, it is preferable that the impurity concentration of the middle-concentration drift regions is reduced gradually or in stages, from the high-concentration drift region 6 side toward the low-concentration drift region 10 side.

In the first and second embodiments, this technology is applied to monopolar FETs. However, this technology may be applied to bipolar transistors. The FET mentioned in this specification is not limited to a monopolar transistor, but includes IGBT, for example. While the drain region 4 and the drain electrode 2 are formed on the rear surface of the semiconductor substrate in the first and second embodiments, the drain region 4 and the drain electrode 2 may be formed on the surface of the semiconductor substrate. For example, a drain region 4 may be provided at a position exposed to the surface of the semiconductor substrate, between a pair of p-type well regions 12, 12, and a drain electrode 2 may be provided on the surface of the drain region 4. The gate electrode 18 and the insulating film 16 are only required to be formed in a range that is opposed to a range of the p-type well region 12 which separates the source region 14 from the drift region 10, and need not be formed over a gap between the pair of p-type well regions 12, 12. The drift electrode may be provided on the surface of the semiconductor substrate, so as not to interfere with the gate electrode 18.

As will be described later, the drain region 4, drift regions 6, 8, 10, body region 12, and the source region 14 are formed of GaN. GaN has high resistance to breakdown, and the semiconductor device formed of GaN is more likely to be used in a condition where a high voltage is applied to the device, as compared with a semiconductor device formed of Si. Therefore, a large potential difference is likely to appear in the insulating film 16, and the gate withstand voltage is likely to be a problem. This problem is not limited to GaN, but is common to wide-gap semiconductors having a wider band gap than Si. The technology described in this disclosure is useful to semiconductor devices comprised of a III-V group semiconductor, such as a nitride semiconductor, having a wide band gap, silicon carbide, diamond, or the like.

Figure 3:
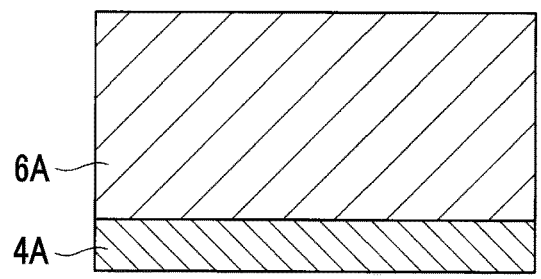
FIG. 3 is a view showing a first step when the semiconductor device of the first embodiment is produced.

The production method of the semiconductor device of the first embodiment will be described. Referring to FIG. 3, a seed substrate 4A as a start substrate for epitaxial growth is prepared. Since the seed substrate 4A will be the drain region 4 later, a substrate containing an n-type impurity in a concentration suitable for the drain region 4 is selected as the seed substrate 4A. In actual production, the rear surface of the seed substrate 4A is ground after a series of process steps, so that the thickness of the drain region 4 is appropriately adjusted. The thickness of the seed substrate 4A in each stage of FIG. 3-FIG. 9 is larger than the thickness illustrated in the drawings. Then, a GaN crystal layer 6A containing an n-type impurity is formed by epitaxial growth on a surface of the seed substrate 4A. In this stage, the crystal is grown until it reaches the position of the top of the vertical portion denoted by reference numeral 6b in FIG. 1. Since the GaN crystal layer 6A will be the high-concentration drift region 6 later, the crystal growth process is adjusted so that the crystal of GaN containing an n-type impurity in a concentration suitable for the high-concentration drift region 6 is grown.

Figure 4:
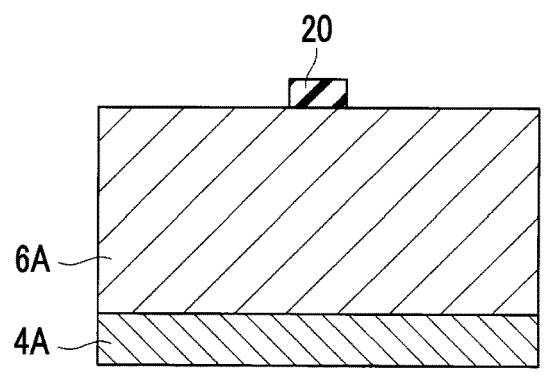
FIG. 4 is a view showing a second step when the semiconductor device of the first embodiment is produced.
Figure 5:
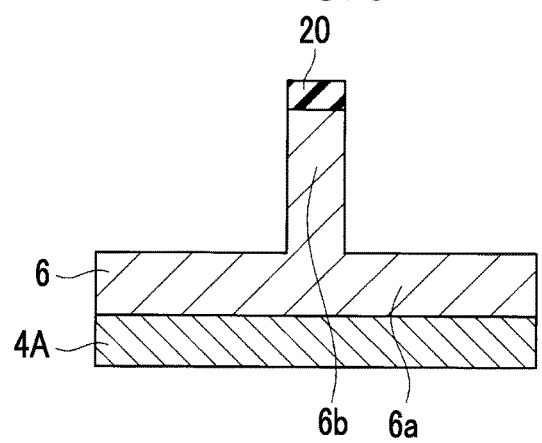
FIG. 5 is a view showing a third step when the semiconductor device of the first embodiment is produced.
Figure 6:
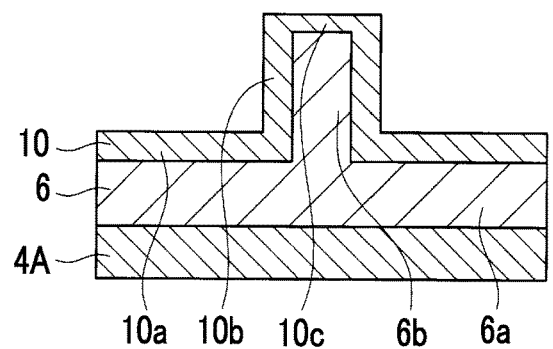
FIG. 6 is a view showing a fourth step when the semiconductor device of the first embodiment is produced.

Referring to FIG. 4, a mask layer is formed over the entire area of the surface of the GaN crystal layer 6A, and the mask layer formed on a portion other than a range in which the vertical portion 6b is formed is removed, so that a mask layer 20 that covers only the range of formation of the vertical portion 6b is formed. Referring to FIG. 5, anisotropic etching for etching the GaN crystal layer 6A, without etching the mask layer 20, is performed. As a result, the vertical portion 6b is formed beneath the mask layer 20. The anisotropic etching is carried out until the thickness of the horizontal portion 6a becomes equal to an expected value. Referring to FIG. 6, the mask layer 20 shown in FIG. 5 is removed, and epitaxial growth (another crystal growth process) of a GaN crystal layer is carried out. At this time, the crystal growth process is adjusted so that the crystal of GaN containing an n-type impurity in a concentration suitable for the low-concentration drift region 10 is grown. As a result, the horizontal portion 10a is grown on a surface of the horizontal portion 6a, and the vertical portion 10b is grown on each side face of the vertical portion 6b, while the upper horizontal portion 10c is grown on the top face of the vertical portion 6b.

Figure 7:
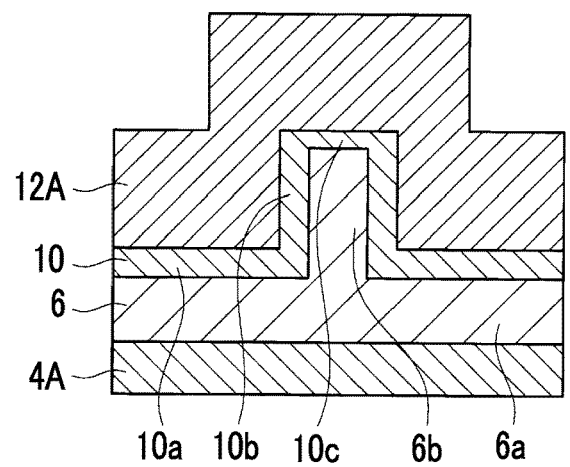
FIG. 7 is a view showing a fifth step when the semiconductor device of the first embodiment is produced.
Figure 8:
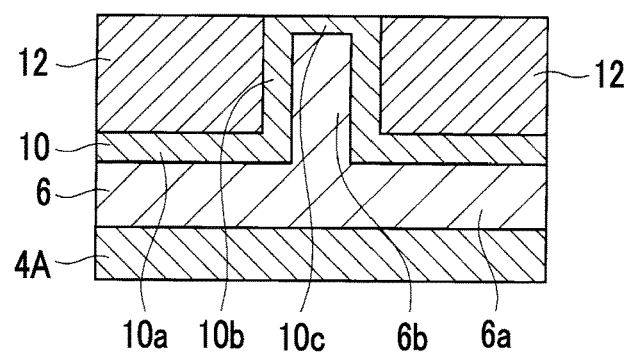
FIG. 8 is a view showing a sixth step when the semiconductor device of the first embodiment is produced.

Referring next to FIG. 7, the GaN layer 12A containing a p-type impurity in a concentration suitable for the p-type well region 12 is formed by crystal growth (third crystal growth). Referring next to FIG. 8, the p-type GaN layer 12A is etched, starting with its surface, so that the upper horizontal portion 10c is exposed. As a result, the p-type well regions 12, 12 exposed to the surface of the semiconductor substrate are formed.

Figure 9:
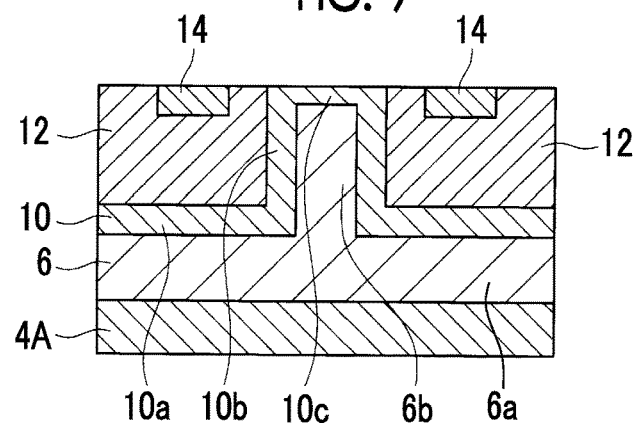
FIG. 9 is a view showing a seventh step when the semiconductor device of the first embodiment is produced.
Figure 10:
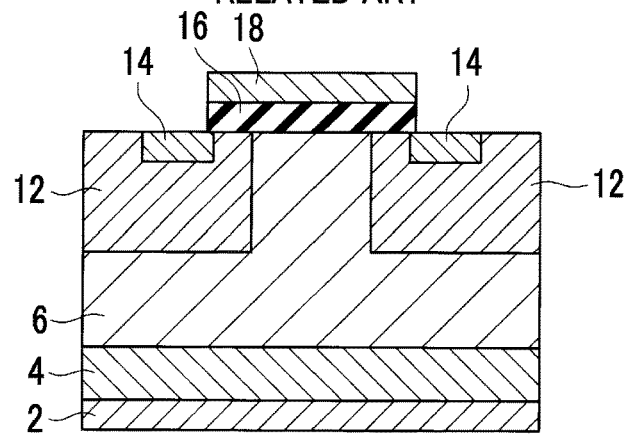
FIG. 10 is a cross-sectional view of a semiconductor device according to the related art.
Figure 11:
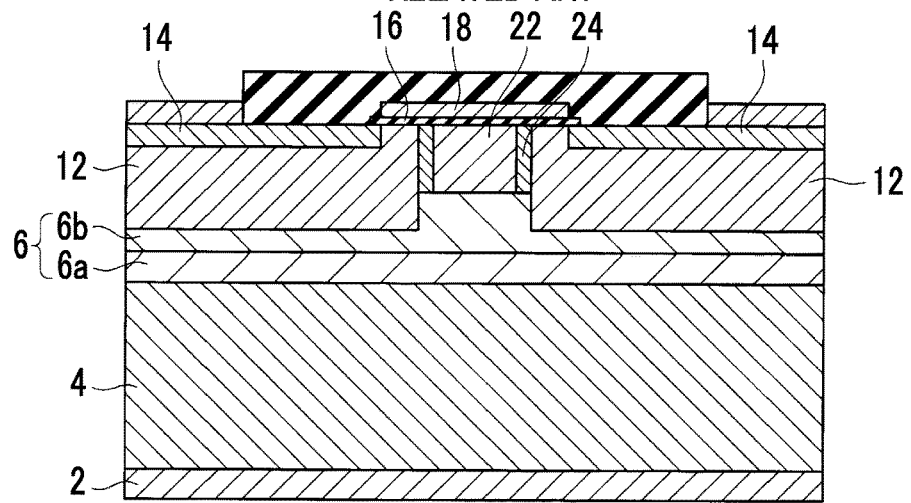
FIG. 11 is a cross-sectional view of an improved semiconductor device according to the related art.

Referring next to FIG. 9, an n-type impurity is injected into a range exposed to a surface of a part of each p-type well region 12, and is activated through heat treatment, so that the n-type source region 14 is performed. Then, the insulating film 16 is formed by a CVD method, or the like, and the gate electrode 18 is formed by a liftoff method, or the like. Also, an interlayer insulating film (not shown) is formed, in which an opening that reaches the source region 14 is provided, and a source electrode (not shown) that passes the opening is formed. Then, the rear surface of the seed substrate 4A is ground, so that the thickness of the drain region 4 is appropriately adjusted, and the drain electrode 2 is formed on the rear surface of the drain region 4. In the manner as described above, the semiconductor device shown in FIG. 1 is produced.

While specific examples of the disclosure have been described in detail, these examples are presented for illustrative purposes only, and are not meant to limit the scope of the disclosure. The technologies described in the appended claims include those obtained by modifying or changing the illustrated specific examples in various ways. The technical elements described in the specification or the drawings exhibit technical usefulness by themselves or in various combinations, and are not limited to combinations described in the claims as filed. Also, the technology illustrated by way of example in this specification or the drawings can achieve two or more objects at the same time, and has technical usefulness when it achieves one of these objects.

What is claimed is:

1. A semiconductor device comprising:
an outside-of-well n-type region;
a p-type well region that is surrounded by the outside-of-well n-type region and is exposed to a surface of a semiconductor substrate;
an inside-of-well n-type region that is surrounded by the p-type well region and is exposed to the surface of the semiconductor substrate; and
a gate electrode that is opposed, via an insulating film, to a surface of the p type well region in an area in which the outside-of-well n-type region and the inside-of-well n-type region are separated from each other, wherein
the outside-of-well n-type region includes an impurity low-concentration region that is in contact with the p-type well region, and an impurity high-concentration region that is separated from the p-type well region by the impurity low-concentration region, the impurity low-concentration region containing a lower concentration of an n-type impurity than the impurity high-concentration region, and
the impurity high-concentration region includes a first portion and a second portion, the first portion having a first thickness in a thickness direction of the semiconductor substrate, the second portion having a second thickness in the thickness direction, the second thickness being larger than the first thickness and the second portion protruding from the first portion towards the surface of the semiconductor substrate.

2. The semiconductor device according to claim 1, wherein an impurity middle-concentration region is provided between the impurity low-concentration region and the impurity high-concentration region.

3. The semiconductor device according to claim 1, wherein the outside-of-well n-type region comprises an epitaxially grown, nitride semiconductor.

4. The semiconductor device according to claim 1, wherein the insulating film and the gate electrode extend over a gap between adjacent ones of the p-type well region, and, in the gap, the impurity low-concentration region is in contact with the insulating film.

* * * * *